May 29, 1962 A. R. WARNER ET AL 3,037,145

OSCILLATOR CIRCUITS

Filed April 4, 1960

INVENTORS
DERRICK ARNOTT WARD
ARTHUR RICHARD WARNER

BY Darby & Darby
ATTORNEYS 3,037,145
Patented May 29, 1962

3,037,145

OSCILLATOR CIRCUITS

Arthur Richard Warner, 23 The Vale, Chelsea, London, England, and Derrick Arnott Ward, 30 Gravel Hill, Addington, Surrey, England Filed Apr. 4, 1960, Ser. No. 19,936
8 Claims. (Cl. 315—166)

This invention relates to oscillator circuits, and more particularly to oscillator circuits which are used with neon tube signs to periodically make the discharge in the neon tube increase gradually along the length thereof thereby producing a writing effect.

In our prior United States Patent 2,598,473, a circuit is disclosed which is used for supplying power to a neon tube advertising display device. The circuit of that patent produces a radio frequency signal whose amplitude increases in a substantially linear manner. This causes the gas discharge in the neon tube to increase gradually along its length, and when the neon tube is formed in the shape of a word, a writing effect is produced.

The circuit disclosed in the aforesaid patent is a modulated power oscillator. The power oscillator generates radio frequency energy which is supplied to the neon tube. A sawtooth control voltage is produced by a blocking oscillator sawtooth generator and this control voltage is applied to the screen grid of the power oscillator thereby varying the gain and output of the power oscillator in accordance with the sawtooth signal.

In accordance with the present invention, a power amplifier is used to supply the varying radio frequency energy to the neon tube. The power amplifier is modulated with two signals, the first is a constant amplitude radio frequency signal from a sine wave oscillator circuit. The second signal is a sawtooth signal from a free running sawtooth generator. These two signals, in a preferred form of the invention, are applied directly to the control grid of the power amplifier. The radio frequency signal is produced at a low level in the constant amplitude oscillator circuit. The low level radio frequency signal is then amplified to the required level by the power amplifier, which also receives a low level sawtooth signal to thereby control its gain. In this manner, a radio frequency signal is produced at the output of the power amplifier which increases in amplitude in accordance with the sawtooth control voltage.

It is therefore an object of this invention to provide a circuit which is capable of producing radio frequency energy which increases linearly in amplitude.

Another object of this invention is to provide a circuit for producing a writing effect on a neon tube.

Still a further object of this invention is to provide an oscillator circuit for supplying power to a neon tube in which a constant amplitude radio frequency signal and a sawtooth signal are amplified in a power amplifier stage, the output signal from the power amplifier being supplied to the neon tube.

Figure 1:
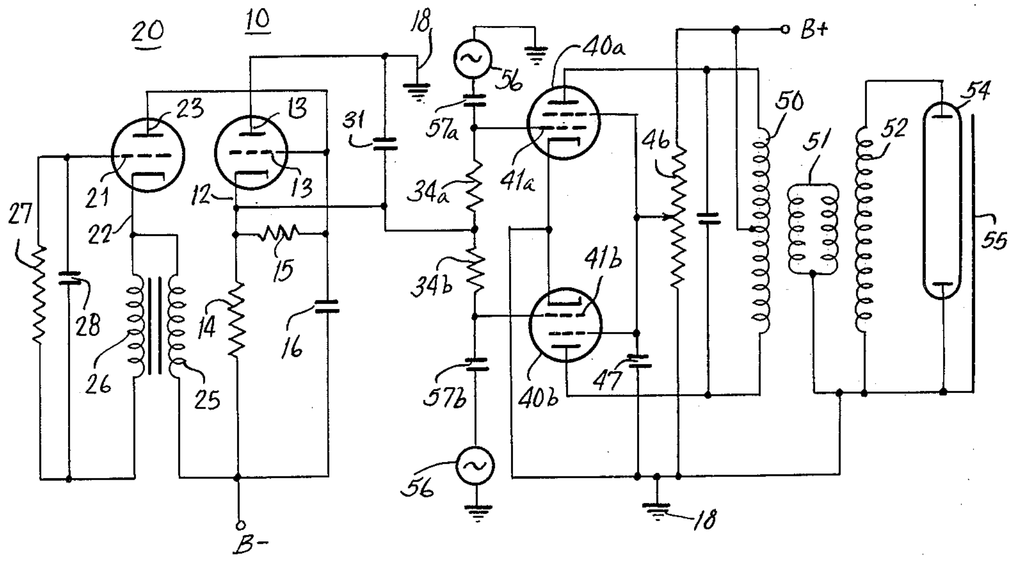
Figure 2:
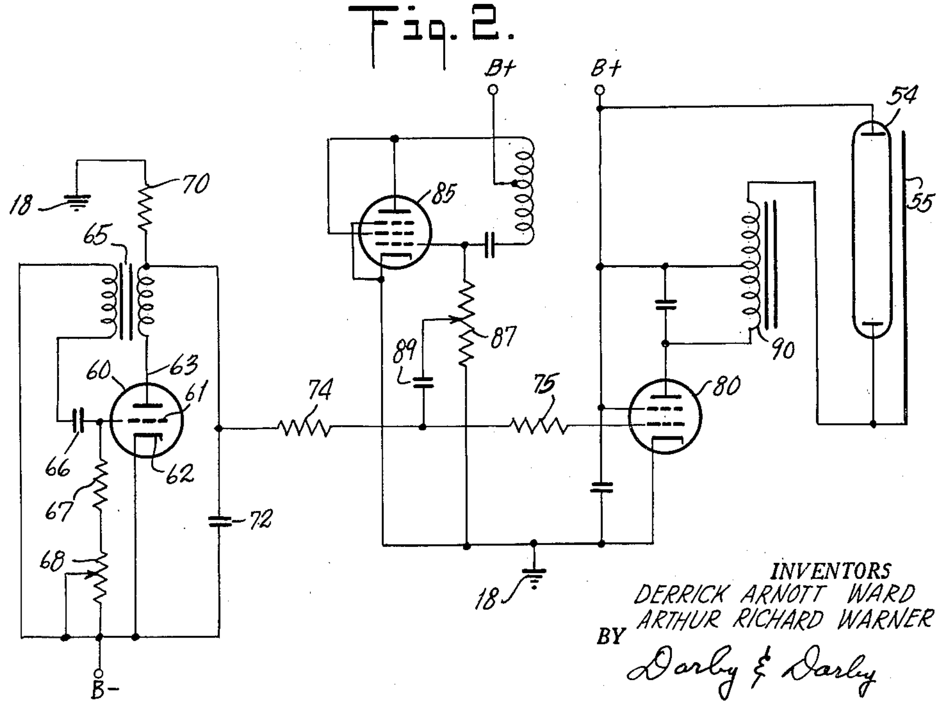

Other objects and advantages of the present invention will become more apparent upon reference to the following specification and annexed drawings, wherein:

FIGURE 1 is a schematic diagram of one form of the invention which utilizes a push-pull power amplifier output stage; and FIGURE 2 is a schematic diagram of another form of the invention utilizing a single-ended power amplifier output stage.

Referring to FIG. 1, the sawtooth control voltage waveform is generated by a cathode follower tube 10 and a single swing type blocking oscillator 20. The two tubes 10 and 20 are triode type tubes having respective control grid electrodes 11 and 21; cathode electrodes 12 and 22; and plate electrodes 13 and 23. The two tubes 10 and 20 may be housed in a single envelope if so desired. It should also be realized that other tube types or semiconductor devices may be used for the elements 10 and 20.

The remainder of the cathode follower-tube circuit is formed by a cathode resistor 14 which is connected between the cathode 12 and a suitable source of negative potential B—. A grid resistor 15 is connected between the control grid 11 and the cathode 12 and a capacitor 16 is connected from the grid 11 to the source of B— potential. The plate 13 of the tube 10 is connected to a suitable source of reference potential such as ground 18, which is positive with respect to the potential applied to the cathode 12.

The blocking oscillator 20 has a transformer 24, which has one winding 25 connected from the cathode 22 to the source of B— potential. The second winding 26 of the transformer 24 is connected from the cathode 22 back to the control grid electrode 21 through a parallel connected RC time constant network formed by a resistor 27 and a capacitor 28. In accordance with the operation of the blocking oscillator circuit, the values of the resistor 27 and the capacitor 28 largely determines the frequency of conduction of the blocking oscillator circuit 20. This in turn controls the duration of the sawtooth control waveform.

The leading edge of the sawtooth waveform is produced as the capacitor 16 charges through the resistor 15 and the anode to cathode path of the tube 10. Since the capacitor 16 is connected to the control electrode 11, the variation that appears across it is supplied to the control grid 11 and therefore the tube 10 is made to conduct accordingly. Consequently, as the end of capacitor 16 which is connected to the control grid 11 becomes more positive, the conduction of the tube 10 increases. This produces a voltage drop across resistor 14 and accordingly reduces the negative potential appearing at the cathode 12. The capacitor 16 charges substantially linearly and the leading edge of a sawtooth voltage is thereby produced at the cathode 12.

The blocking oscillator 20 which produces the trailing edge of the sawtooth waveform serves to discharge the capacitor 16. This is done rapidly so that the composite wave produced at the cathode 12 has a substantially linear, slowly rising leading edge and a sharply decreasing trailing edge. In order to discharge the capacitor 16, the plate 23 of tube 20 is connected to one end of the capacitor 16 and the cathode 22 is connected through the winding 25 of the transformer 24 to the other end of capacitor 16. Therefore, when tube 20 conducts, it presents a substantially zero resistance and the capacitor 16 is discharged rapidly therethrough.

Considering the operation of the blocking oscillator 20, assume that a negative charge is present on the plate of the capacitor 28 connected to the control grid 21, thereby cutting off the tube 20. As the charge on capacitor 28 leaks away through resistor 27, tube 20 starts to conduct. When this happens, current is drawn through the winding 25 of the transformer 24. The changing current through the winding 25 induces a voltage in the winding 26 which is supplied back to the control grid 21. The windings 25 and 26 of the transformer 24 are arranged so that voltage induced back into the grid 21 is of such polarity as to increase the conduction of tube 20 towards saturation. As is well known, in the operation of such blocking oscillators, once the conduction occurs, it increases very rapidly. When this happens, the capacitor 16 is rapidly discharged, thereby forming a very sharp trailing edge for the sawtooth waveform.

When the tube 20 saturates, there is no induced voltage in the winding 26 for an instant, and, because no charging potential is being applied, the capacitor 28 begins to discharge. This discharge causes the positive potential on the grid electrode 21 to become less positive, thereby causing less current to flow in the winding 25. At this time, the control grid 21 is highly positive with respect to the cathode 22 and therefore draws a substantial amount of grid current. Consequently, electrons accumulate on the plate of the capacitor 28 connected to the control grid 21. The magnetic field around the winding 25 starts to collapse and induces a voltage in the winding 26 in the reverse direction, causing the control grid 21 to become more negative. This process continues until the control grid is driven beyond cutoff, thus completing a cycle of operation. Oscillation occurs again, i.e., the tube 20 conducts, when the negative charge on the capacitor 28 at the grid 21 leaks off through the resistor 27.

In the embodiment of the invention shown in FIG. 1, a particular type of oscillator and cathode follower tube arrangement has been shown in which the circuit is operated from a source of B— potential applied to the cathodes of the tubes 10 and 20, the plate of the vacuum tube 10 being connected to ground or a point of less negative potential. It should be realized that other types of control oscillator circuits may be utilized. Also, the conventional arrangement may be utilized wherein the voltages are reversed, i.e., positive voltage applied to the plates of the vacuum tubes and the cathodes being kept at substantially ground potential.

The sawtooth waveform which is generated by the tubes 10 and 20 appears at the cathode 12 of the vacuum tube 10 and also across the capacitor 31 which is connected between ground 18 and cathode 12. This sawtooth control voltage which increases positively with respect to ground potential is applied through two resistors 34*a* and 34*b* to the control grids 41*a* and 41*b* of two power amplifier tubes 40*a* and 40*b*. The power amplifier tubes 40*a* and 40*b* are connected in a conventional push-pull circuit configuration. The cathodes of the tubes 40*a* and 40*b* are connected to ground 18, while positive potential is supplied from a suitable source of B+ potential to the screen grids of tubes 40*a* and 40*b* through the center arm of a potentiometer 46. The ends of potentiometer 46 are connected across B+ and ground. A screen bypass capacitor 47 is provided for both tubes.

Positive potential is applied to the plates of the tubes 40*a* and 40*b* from the B+ supply through the center tap of a transformer winding 50. The winding 50 also serves as the output for the amplifier tubes 40*a* and 40*b*. Tubes 40*a* and 40*b* operate as a conventional push-pull amplifier and therefore no further description of the circuit operation is necessary.

A sine wave signal of radio frequency which is produced by an oscillator 56 is also supplied to the control grids 41*a* and 41*b* through the respective capacitors 57*a* and 57*b*. The oscillator 56 may be any suitable type of oscillator which is capable of producing a constant amplitude radio frequency signal. For example, oscillators of the Hartley, Colpitts, electron-coupled type, etc., may be utilized. In order that the tubes 40*a* and 40*b* may operate as push-pull circuit, the signals applied to their respective grids 41*a* and 41*b* should be 180° out of phase. This may be accomplished in any conventional manner.

Therefore, it is seen that two signals are present at the respective control grids 41*a* and 41*b*. These signals are the sawtooth waveform control signals from the discharge tube 10 and the constant amplitude radio frequency sine wave signal from the oscillator 56. The sawtooth signal biases the tubes 40*a* and 40*b* so that the gain of the tubes is controlled in accordance therewith. Maximum negative bias is applied to the control grids 41*a* and 41*b* when tube 10 is cut off. This produces minimum output from the power amplifiers 40*a* and 40*b*. When tube 10 is fully conductive, minimum negative bias is applied to the respective control grids 41*a* and 41*b* and consequently the power amplifier tubes have maximum output.

The linearly varying radio frequency output signal from the winding 50 is coupled through a link coupling 51 to a transformer winding 52, which is connected across the discharge electrodes of a neon tube 54. One end of the winding 52 and the electrode of the neon tube 54 connected to it are connected ot ground 18. A capacitance plate 55 is also connected to this electrode and ground 18. The neon tube may be any suitable type containing the appropriate gases to produce desired colors. The tube 54 may also be in the form of a script word or a series of block letters as is well known in the art. Due to the increasing output from the power amplifier tubes 40*a* and 40*b*, an increasing amplitude voltage is applied across the electrodes of the tube 54 and consequently the discharge proceeds along the length of the tube. If the tube is in the form of a written word, script word or letters, a writing effect is produced.

Briefly explaining the operation of the circuit, as capacitor 16 charges via the tube 10 and resistor 15, the negative bias on tube 10 decreases. Tube 10 therefore passes increasing current and the negative bias applied to the respective control grids 41*a* and 41*b* of tubes 40*a* and 40*b* gradually decreases. Therefore, the output of the power amplifier tubes 40*a* and 40*b* is gradually increased. Since the output from the tube 10 is a sawtooth wave, the output of the power amplifier tubes is also the same. The period of the sawtooth may be adjusted by changing the values of the resistor 27 and the capacitor 28 and/or varying the B— potential applied to the tubes 10 and 20. This period may be varied to suit the particular application. For example, the longer the neon tube the longer the period should be. The rate at which C16 charges, and hence the speed of writing, is dependent upon the time constant of R15 and C16. The values of these components may also be varied as desired.

Referring to FIG. 2, another circuit is shown which requires fewer components than the circuit shown in FIG. 1. In the circuit of FIG. 2 the cathode follower tube 10 (FIG. 1) has been eliminated. Also, in the circuit of FIG. 2, rather than utilizing a push-pull power output stage, a single ended power output stage is used.

Referring to FIG. 2, a conventional blocking oscillator circuit is formed by a vacuum tube 60 having a respective control grid electrode 61, cathode 62, and plate 63. A feedback transformer 65 is connected between the plate 63 and control grid 61 by a capacitor 66. The time constant of the circuit is determined by the value of the capacitor 66 and by a resistor 67 and an adjustable potentiometer 68. The latter two resistors are connected in series between the control grid 61 and B—.

The plate 63 is grounded through a suitable resistor 70 and one of the windings of the transformer 65. Also connected to the resistor 70 is a capacitor 72 across which the sawtooth wave is developed. In operation, when tube 60 is cutoff, capacitor 72 charges to ground potential through resistor 70. At a predetermined time, which is determined by the values of the capacitor 66 and the resistors 67 and 68, tube 60 conducts and discharges capacitor 72, thereby forming the sharp trailing edge of the sawtooth wave. This circuit is a conventional one for producing a sawtooth wave.

The sawtooth wave output across capacitor 72 is coupled through a resistor 74 and a resistor 75 to the control grid of a single power amplifier tube 80. The control grid of the power amplifier tube 80 also receives a constant amplitude sinusoidal signal which is produced by an oscillator 85. Oscillator 85 is shown as being of the Hartley type which is conventional in the art. The output of the oscillator 85 appears across a potentiometer 87, whose ends are connected between the oscillator control grid and ground. The output signal from the oscillator is tapped off by the center arm of the potentiometer and a capacitor 89 couples the radio frequency energy to the control grid of the power amplifier tube 80, through the resistor 75.

The power amplifier tube 80 has applied to its control grid both the sinusoidal radio freqency energy from the oscillator 85 and also the sawtooth waveform from the blocking oscillator 60. Therefore, the output of the power amplifier 80 is a radio frequency signal which increases in amplitude in a linear manner in accordance with the sawtooth wave applied to the control grid. This signal is the same as is produced by the power amplifiers of FIG. 1.

The output signal from tube 80 is applied to one electrode of the neon tube 54 whose other electrode is connected to the source of B+ potential. The neon tube 54 is also provided with a capacitance plate 55, which is connected to ground at one end thereof. As the amplitude of the signal produced by the power amplifier tube 80 increases, the discharge of the neon tube 54 increases along its length. As has been previously explained, when the tube 54 is shaped in the form of a word, a writing effect is produced.

The circuit shown in FIG. 2 is a simplification of that shown in FIG. 1 in that the cathode follower stage has been omitted, with a saving in components, and a single-ended instead of a push-pull amplifier has been utilized.

For the sake of clarity the circuits of FIGS. 1 and 2 have been shown with two separate sources of D.C. supply, viz. B— and B+, each being relative to ground. In both circuits the negative, or B—, supply may be obtained from the grid circuit of the radio frequency oscillator via a suitable resistance-capacity filter.

Therefore, it has been seen that several circuits have been described for use with neon signs in order to produce a writing effect. These circuits essentially comprise components for producing a sawtooth wave; components for producing a sinusoidal radio frequency signal of radio frequency at a constant amplitude; and a power amplifier to which these two signals are applied and in which they are amplified. The output of the power amplifier stage is then applied to the neon tube in order to produce the desired result.

While the preferred embodiments of the invention have been described above, it will be understood that they are illustrative only and the invention is to be limited solely by the appended claims.

What is claimed is:

1. The combination comprising oscillator means for producing a signal of substantially constant amplitude, blocking oscillator means, said blocking oscillator means having a capacitor across which a sawtooth waveform is periodically produced, power amplifier means having a control electrode, and means for applying the signal from said oscillator means and said sawtooth waveform to said control electrode, said power amplifier means thereby producing a signal having the frequency of the signal produced by said oscillator means and varying in amplitude in accordance with said sawtooth waveform.

2. The combination comprising oscillator means for producing a signal of substantially constant amplitude, blocking oscillator means, said blocking oscillator means having a capacitor across which a sawtooth waveform is periodically produced, power amplifier means having a control electrode, means for applying the signal from said oscillator means and said sawtooth waveform to said control electrode, said power amplifier means thereby producing a signal having the frequency of the signal produced by said oscillator means and varying in amplitude in accordance with said sawtooth waveform, a neon tube having discharge electrodes, and means for applying the signal from said power amplifier to the discharge electrodes of said neon tube.

3. The combination comprising oscillator means for producing a signal of substantially constant amplitude, means for generating a control signal, power amplifier means, said power amplifier means including two amplifiers, each of said amplifiers having a respective control electrode, means for connecting said amplifiers in a push-pull circuit arrangement, means for applying the signal from said oscillator to each of said control electrodes with a phase relationship substantially 180° out of phase, and means for applying said control signal to said control electrodes, said power amplifier means thereby producing a signal having the frequency of the signal produced by said oscillator means and varying in amplitude in accordance with said control signal.

4. The combination comprising oscillator means for producing a signal of substantially constant amplitude, means for generating a control signal, power amplifier means, said power amplifier means including two amplifiers, each of said amplifiers having a respective control electrode, means for connecting said amplifiers in a push-pull circuit arrangement, means for applying the signal from said oscillator to each of said control electrodes with a phase relationship substantially 180° out of phase, means for applying said control signal to said control electrodes, said power amplifier means thereby producing a signal having the frequency of the signal produced by said oscillator means and varying in amplitude in accordance with said control signal, a neon tube having discharge electrodes, and means for applying the signal from said power amplifier means to the discharge electrodes of said neon tube.

5. The combination comprising oscillator means for producing a signal having a substantially constant amplitude, means for periodically producing a sawtooth waveform, power amplifier means, said power amplifier means including two amplifiers, each of said amplifiers having a respective control electrode, means for connecting said amplifiers in a push-pull circuit arrangement, means for applying the signal from said oscillator means to each of said control electrodes with a phase relationship substantially 180° out of phase, and means for applying said sawtooth waveform to said control electrodes, said power amplifier means thereby producing a signal having the frequency of the signal produced by said oscillator means and varying in amplitude in accordance with said control signal.

6. The combination comprising oscillator means for producing a signal having a substantially constant amplitude, means for periodically producing a sawtooth waveform, power amplifier means, said power amplifier means including two amplifiers, each of said amplifiers having a respective control electrode, means for connecting said amplifiers in a push-pull circuit arrangement, means for applying the signal from said oscillator means to each of said control electrodes with a phase relationship substantially 180° out of phase, means for applying said sawtooth waveform to said control electrodes, said power amplifier means thereby producing a signal having the frequency of the signal produced by said oscillator means and varying in amplitude in accordance with said control signal, a neon tube having discharge electrodes, and means for applying the signal from said power amplifier means to the discharge electrodes of said neon tube.

7. The combination comprising oscillator means for producing a signal having a substantially constant amplitude, blocking oscillator means, said blocking oscillator means having a capacitor across which a sawtooth waveform is periodically produced, power amplifier means, said power amplifier means including two amplifiers, each of said amplifiers having a respective control electrode, means for connecting said amplifiers in a push-pull circuit arrangement, means for applying the signal from said oscillator means to each of said control electrodes with a phase relationship substantially 180° out of phase, and means for applying said sawtooth waveform to said control electrodes said power amplifier means thereby producing a signal having the frequency of the signal produced by said oscillator means and varying in amplitude in accordance with said control signal.

8. The combination comprising oscillator means for producing a signal having a substantially constant amplitude, blocking oscillator means, said blocking oscillator means having a capacitor across which a sawtooth waveform is periodically produced, power amplifier means, said power amplifier means including two amplifiers, each of said amplifiers having a respective control electrode, means for connecting said amplifiers in a push-pull circuit arrangement, means for applying the signal from said oscillator means to each of said control electrodes with a phase relationship substantially 180° out of phase, means for applying said sawtooth waveform to said control electrodes, said power amplifier means thereby producing a signal having the frequency of the signal produced by said oscillator means and varying in amplitude in accordance with said control signal, a neon tube having discharge electrodes, and means for applying the signal from said power amplifier means to the discharge electrodes of said neon tube.

References Cited in the file of this patent

UNITED STATES PATENTS 2,598,473 Warner et al. ---------- May 27, 1952